United States Patent [19]

Ishimoto

[11] Patent Number: 5,706,219

[45] Date of Patent: Jan. 6, 1998

[54] INTERPOLATION DEVICE

[75] Inventor: Shigeru Ishimoto, Yokohama, Japan

[73] Assignee: Sony Magnescale Inc., Tokyo, Japan

[21] Appl. No.: 594,036

[22] Filed: Jan. 30, 1996

[30] Foreign Application Priority Data

Jan. 30, 1995 [JP] Japan .................................. 7-012985
Jan. 30, 1995 [JP] Japan .................................. 7-012986

[51] Int. Cl.[6] .................................................. G06F 17/17
[52] U.S. Cl. .................................................... 364/724.1
[58] Field of Search ........................... 364/724.1, 723, 364/607

[56] References Cited

U.S. PATENT DOCUMENTS

| | | | |
|---|---|---|---|
| 4,101,964 | 7/1978 | Betts | 364/724.13 |
| 4,785,181 | 11/1988 | Kimizuka et al. | 250/237 |
| 5,216,626 | 6/1993 | Kranitzky | 364/561 |
| 5,293,369 | 3/1994 | Melas et al. | 364/723 |
| 5,515,402 | 5/1996 | Chester | 364/724.1 |

FOREIGN PATENT DOCUMENTS

| | | |
|---|---|---|
| 0 408 799 | 1/1991 | European Pat. Off. . |
| 49-106744 | 10/1974 | Japan . |
| 5-18364 | 3/1993 | Japan . |
| 7-94989 | 10/1995 | Japan . |
| 2 191 004 | 12/1987 | United Kingdom . |

OTHER PUBLICATIONS

Patent Abstracts of Japan, JP 7-057180, Mar. 3, 1995.
Patent Abstracts of Japan, vol. 14, No. 511, JP 2-2117320, Aug. 23, 1990.
Patent Abstracts of Japan, vol. 11, No. 370, JP 62-142220, Jun. 25, 1987.
Patent Abstracts of Japan, vol. 17, No. 84, JP 4-285805, Oct. 9, 1992
Patent Abstracts of Japan, vol. 17, No. 187, JP 4-339206, Nov. 26, 1992.

*Primary Examiner*—Tan V. Mai
*Attorney, Agent, or Firm*—Foley & Lardner

[57] ABSTRACT

An interpolation device for executing an interpolation of cyclic analog signals includes an analog-digital converter which converts the analog signal to a digital signal. A digital filter removes a high-frequency component of the output digital signal from the analog-digital converter, and the filtered digital signal is interpolated by an interpolation section. Therefore, the deviation of the lower several bits of the digital signal to be inputted to the interpolation section is suppressed so as to prevent the degrading of the accuracy due to such deviations.

12 Claims, 18 Drawing Sheets

| SPILIT NUMBER | 16n | | 8(2n-1) | | 4(2n-1) | |
|---|---|---|---|---|---|---|
| OUTPUT | A | B | A | B | A | B |
| QUADRANT I | a | b | a | b | a | b |
| QUADRANT II | a | b | $\bar{a}$ | $\bar{b}$ | b | $\bar{a}$ |
| QUADRANT III | a | b | a | b | $\bar{a}$ | $\bar{b}$ |
| QUADRANT IV | a | b | $\bar{a}$ | $\bar{b}$ | $\bar{b}$ | a |

FIG.11

TRUTH TABLE    MSB

| QUADRANT | SC | LOWER ADDRESS | UPPER ADDRESS |
|---|---|---|---|
| I | 11 | SIN | COS |
| II | 10 | $\overline{COS}$ | SIN |
| III | 00 | $\overline{SIN}$ | $\overline{COS}$ |
| IV | 01 | COS | $\overline{SIN}$ |

TABLE 1

FIG.16

|    | 1 | 2 | 3 | 4 | 5 | 6 | 7 | 8 | 9 | 10 | 11 | 12 | 13 | 14 | 15 | 16 |
|----|---|---|---|---|---|---|---|---|---|----|----|----|----|----|----|----|
| 16 | 15| 15| 14| 13| 13| 12| 12| 11| 11| 10 | 9  | 9  | 8  | 8  | 8  | 8  |
| 15 | 15| 15| 14| 13| 13| 12| 11| 11| 10| 10 | 9  | 9  | 8  | 8  | 8  | 7  |
| 14 | 15| 15| 14| 13| 13| 12| 11| 10| 10| 9  | 9  | 8  | 8  | 8  | 7  | 7  |
| 13 | 15| 15| 14| 13| 12| 11| 11| 10| 10| 9  | 8  | 8  | 8  | 7  | 7  | 6  |
| 12 | 15| 15| 14| 13| 12| 11| 10| 10| 9  | 8  | 8  | 7  | 7  | 6  | 6  |    |
| 11 | 15| 14| 13| 12| 12| 11| 10| 9 | 9 | 8  | 7  | 7  | 6  | 6  | 5  |    |
| 10 | 15| 14| 13| 12| 11| 10| 10| 9 | 8 | 8  | 7  | 6  | 6  | 6  | 5  | 5  |
| 9  | 15| 14| 13| 12| 11| 10| 9 | 8 | 8 | 7  | 6  | 6  | 5  | 5  | 5  | 4  |
| 8  | 15| 14| 13| 11| 10| 9 | 8 | 8 | 7 | 6  | 6  | 5  | 5  | 5  | 4  | 4  |
| 7  | 15| 14| 12| 11| 10| 8 | 8 | 7 | 6 | 5  | 5  | 5  | 4  | 4  | 4  | 3  |
| 6  | 15| 13| 12| 10| 9 | 8 | 7 | 6 | 5 | 5  | 4  | 4  | 4  | 3  | 3  | 3  |
| 5  | 15| 13| 11| 9 | 8 | 6 | 5 | 5 | 4 | 4  | 3  | 3  | 3  | 3  | 2  | 2  |
| 4  | 15| 12| 10| 8 | 6 | 5 | 4 | 4 | 3 | 3  | 2  | 2  | 2  | 2  | 2  | 2  |
| 3  | 15| 11| 8 | 5 | 4 | 3 | 3 | 2 | 2 | 2  | 1  | 1  | 1  | 1  | 1  | 1  |
| 2  | 15| 8 | 4 | 3 | 2 | 2 | 2 | 1 | 1 | 1  | 1  | 0  | 0  | 0  | 0  | 0  |
| 1  | 8 | 0 | 0 | 0 | 0 | 0 | 0 | 0 | 0 | 0  | 0  | 0  | 0  | 0  | 0  | 0  |

LOWER ADDRESS (vertical) / UPPER ADDRESS (horizontal)

ABS VALUE

FIG.17

|    | 1 | 2 | 3 | 4 | 5 | 6 | 7 | 8 | 9 | 10 | 11 | 12 | 13 | 14 | 15 | 16 |
|----|---|---|---|---|---|---|---|---|---|----|----|----|----|----|----|----|
| 16 | 3 | 3 | 2 | 1 | 1 | 0 | 0 | 3 | 3 | 2  | 2  | 1  | 1  | 0  | 0  | 0  |
| 15 | 3 | 3 | 2 | 1 | 1 | 0 | 3 | 3 | 2 | 2  | 1  | 1  | 0  | 0  | 0  | 3  |
| 14 | 3 | 3 | 2 | 1 | 1 | 0 | 3 | 2 | 2 | 1  | 1  | 0  | 0  | 0  | 3  | 3  |
| 13 | 3 | 3 | 2 | 1 | 0 | 3 | 3 | 2 | 2 | 1  | 0  | 0  | 0  | 3  | 3  | 2  |
| 12 | 3 | 3 | 2 | 1 | 0 | 3 | 2 | 2 | 1 | 1  | 0  | 0  | 3  | 3  | 2  | 2  |
| 11 | 3 | 2 | 1 | 1 | 0 | 3 | 2 | 1 | 1 | 0  | 0  | 3  | 3  | 2  | 2  | 1  |
| 10 | 3 | 2 | 1 | 0 | 3 | 2 | 2 | 1 | 0 | 0  | 3  | 2  | 2  | 2  | 1  | 1  |
| 9  | 3 | 2 | 1 | 0 | 3 | 2 | 1 | 0 | 0 | 3  | 2  | 2  | 1  | 1  | 1  | 0  |
| 8  | 3 | 2 | 1 | 3 | 2 | 1 | 0 | 0 | 3 | 2  | 2  | 1  | 1  | 1  | 0  | 0  |
| 7  | 3 | 2 | 0 | 3 | 2 | 0 | 0 | 3 | 2 | 1  | 1  | 1  | 0  | 0  | 0  | 3  |
| 6  | 3 | 1 | 0 | 2 | 0 | 0 | 3 | 2 | 1 | 1  | 0  | 0  | 0  | 3  | 3  | 3  |
| 5  | 3 | 1 | 3 | 1 | 0 | 2 | 1 | 1 | 0 | 0  | 3  | 3  | 3  | 3  | 2  | 2  |
| 4  | 3 | 0 | 1 | 0 | 2 | 1 | 0 | 0 | 3 | 3  | 2  | 2  | 2  | 2  | 2  | 2  |
| 3  | 3 | 3 | 0 | 1 | 0 | 3 | 3 | 2 | 2 | 2  | 2  | 1  | 1  | 1  | 1  | 1  |
| 2  | 3 | 0 | 0 | 3 | 2 | 2 | 1 | 1 | 1 | 1  | 0  | 0  | 0  | 0  | 0  | 0  |
| 1  |(0)| 0 | 0 | 0 | 0 | 0 | 0 | 0 | 0 | 0  | 0  | 0  | 0  | 0  | 0  | 0  |

LOWER ADDRESS (vertical) / UPPER ADDRESS (horizontal)

2BIT VALUE

UP/DOWN CONVERSION

CONVERSION OF A/B PHASE

INTERPOLATION DEVICE

BACKGROUND OF THE INVENTION

1. Field of the Invention

The present invention relates to an interpolation device for a linear encoder or rotary encoder which is used in an accurate length-measuring instrument and an accurate angle-measuring instrument.

2. Description of the Prior Art

In order to obtain highly divided interpolation such as above 100 division interpolation by means of an interpolation device for an encoder, various methods have been proposed and are in practical use. For example, there is an interpolation method using a phase modulation signal from a balanced modulator (disclosed in Japanese Patent Publication No. 5-18364), an interpolation method which executes interpolation by calculating the arc-tangent of the input signals by means of a combination of an A/D converter and a digital computer, an interpolation method which obtains interpolation values by using an A/D converter and a look-up table (disclosed in a Japanese Patent Provisional Publication No. 49-106744), and an interpolation method which obtains interpolation values by using a special polar-coordinate transformation IC.

In case where interpolation is executed by using a phase modulation signal, is is necessary to provide a high-frequency interpolation clock and a high-speed logic circuit. Further, since the allowable limit of the response frequency must be smaller than ±5% of the carrier frequency to be balanced-modulated, this type of the interpolation method is not preferable to be applied to an interpolation requiring a high-divisional interpolation and/or a high speed response.

Also, a conventional interpolation method using an A/D converter has the drawback that when the A/D converter receives a signal from an encoder, the digital data outputted from the A/D converter frequently deviates at its lower several bits for each sample data due to the lack of a hysteresis characteristic. Therefore, this interpolation output signal varies and is outputted as high-order noise which makes the interpolation value unstable. In order to prevent such variation, the varying lower bits are rounded down and the rounded data is used, or two-times of necessary interpolation are executed and the obtained data is treated by a hysteresis lower than 1 resolution.

However, there methods requires a resolution higher than the resolution required for the application or higher processing ability in its processing section. Therefore, these methods increase the cost of the system.

SUMMARY OF THE INVENTION

It is an object of the present invention to provide an improved interpolation device which becomes free from the above drawbacks and achieves a high resolution and high-speed interpolation by a relatively simple circuit.

An interpolation device according to the present invention employs cyclic analog signals which periodically change amplitude corresponding to a position function of a displacement. The interpolation device comprises an analog-digital converter which converts the analog signal to a digital signal. A digital filter removes a high-frequency component of the output digital signal from the analog-digital converter. An interpolating means interpolates the output of the digital filter.

BRIEF DESCRIPTION OF THE DRAWINGS

FIG. 11 is a table which shows a correction rule for a sine signal and a cosine signal.

FIG. 16 shows the content of a look-up table for phase A/phase B signal.

FIG. 17 shows the content of a look-up table for a 2-bit signal.

DETAILED DESCRIPTION OF THE INVENTION

An interpolation device according to the present invention is arranged to eliminate a noise component in a high-frequency band of data from an A/D converter (analog-digital converter) by executing filtering by means of a digital filter before the execution of an interpolation process. Further, the interpolation device comprises a hysteresis circuit by which a momentary deviation of the data is suppressed, in order to input stable data into an interpolation section. The A/D converter, which is normally applied to the interpolation device, outputs digital data whose lower several bits always deviate (vary) even if the input to the A/D converter is not changed. For example, if the A/D converter is 8 bit type and 2 Vp-p full scale, the resolution of the A/D converter becomes about 8 mV. In the case of a sound signal or visual signal, the influence of the noise is determined from a ratio between an amplitude of the signal and that of noise (S/N), and effective values of the signal and noise are compared. Therefore, it is not necessary to pay attention to the resolution in such a case. In the case of the signals of the encoder, such deviation at the lower several bits influences the signal as a noise.

In the case where a comparator interpolates a signal from an encoder, a hysteresis of about 20 to 30 mV is applied to the signal in order to prevent the generation of drift of the output value. Accordingly, the A/D converter, which has a resolution of 8 mV, deviates within three or four values, that is, the A/D converter outputs the digital data which drifts at its two lower bits. Such drift of the digital data is suppressed by a digital filter, and the filtered data is processed by an interpolation method, such as a calculation of arc-tangent or an interpolation circuit using a look-up table.

Referring to FIGS. 1 to 8, there is shown a first embodiment of the interpolation device according to the present invention.

Figure 1:
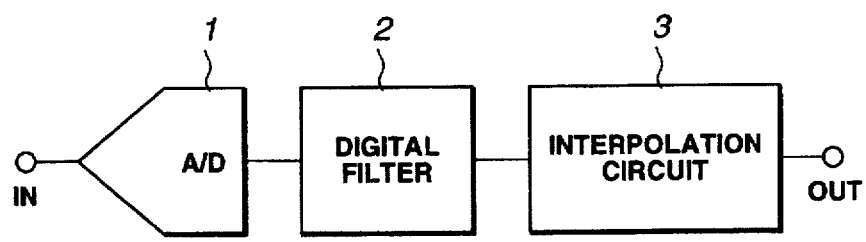
FIG. 1 is a block diagram of a first embodiment of an interpolation device according to the present invention.

As shown in FIG. 1, an analog signal is inputted to an A/D converter 1 in order to be converted into a digital signal. The converted digital signal is inputted to a digital filter 2 wherein a high-frequency component of the converted digital signal is eliminated, that is, the several lower bits of the digital data are rounded (rounded up or rounded down). Then, the rounded digital data is inputted to an interpolation circuit 3 wherein an interpolation is executed.

The interpolation circuit 3 is basically constituted by a low pass filter. An additive mean may be obtained using a simple interpolation method, and it is well known that such method is easily implemented using hard ware.

Figure 2:
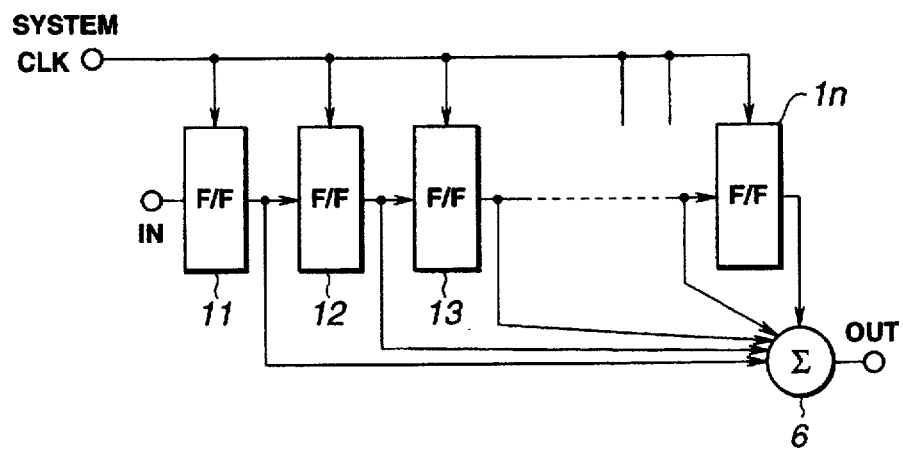
FIG. 2 is a circuit diagram of a digital filter applied to the interpolation device of FIG. 1.

FIG. 2 shows a typical digital filter where a plurality of delayed signals synchronized with the signal of a clock are added at an adder 6. Such a digital filter may be comprised of a computer. However, even if an analog filter is applied for processing a signal to be inputted to the A/D converter, the drift of data outputted from the A/D converter is not suppressed.

Figure 5:
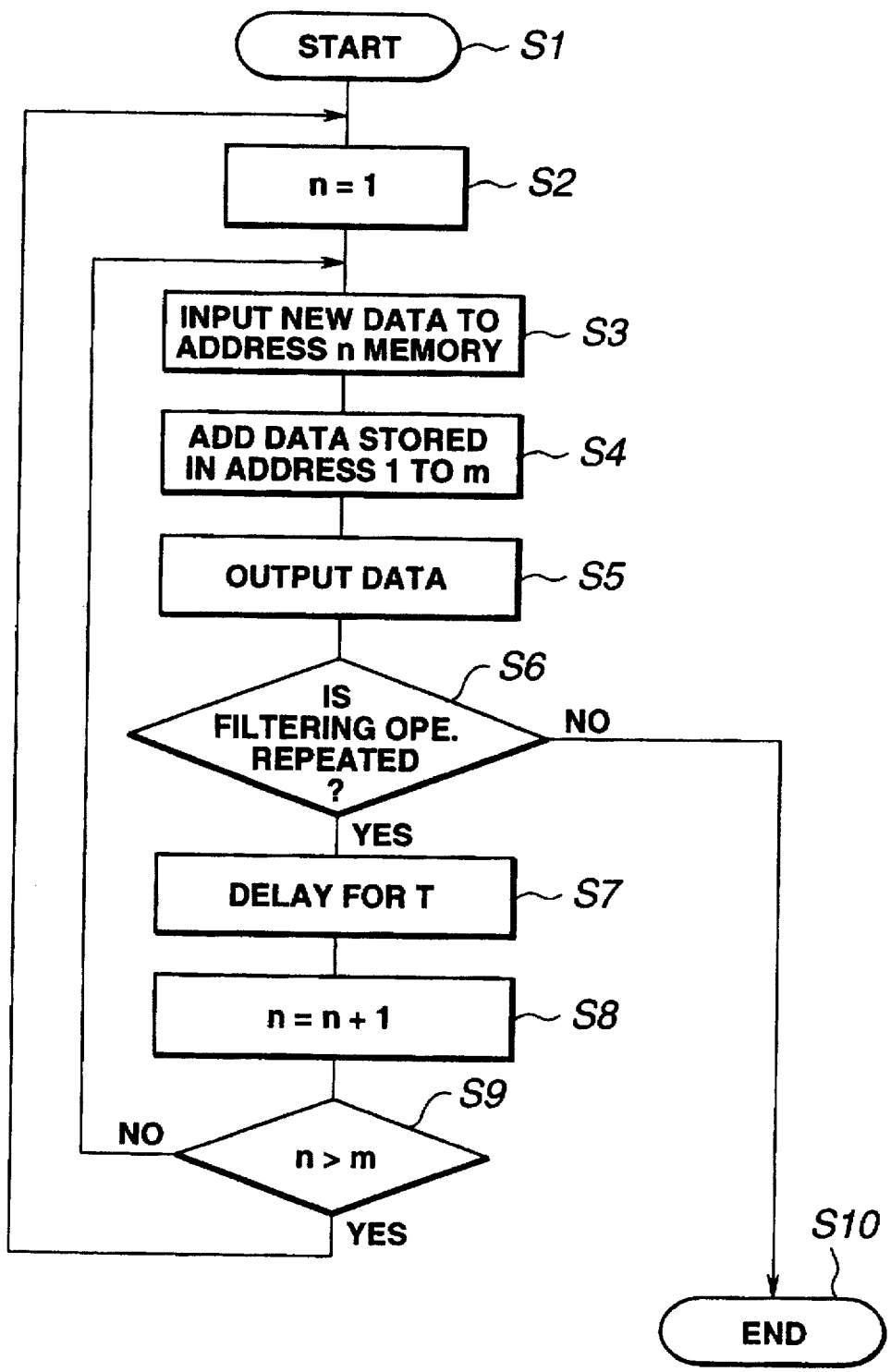
FIG. 5 is a flowchart which shows a method for calculating an additive mean of inputted data.

A manner of the operation for obtaining an additive mean by a computer will be discussed hereinafter with reference to the flowchart of FIG. 5.

At step S1, the calculation for obtaining an additive mean is started.

At step S2, a first address n of a memory is set at 1 (n=1).

At step S3, new data is inputted to a position in memory addressed by n.

At step S4, data at addresses 1 to m are summed. A m-steps data adding filter is applied to this filter.

At step S5, the sum of the data is outputted. With these steps S1 to S5, one filtering operation is completed and the routine proceeds to a step S10 wherein the routine comes to an end.

At step S6, it is decided whether the filtering operation is repeated or not. When the decision at step S6 is "YES", the routine proceeds to step S7. On the other hand, when the decision at step S6 is "NO", the routine proceeds to step S10 wherein the routine comes to an end.

In the case where the operation is continued, the routine proceeds to step S7 wherein a predetermined time period T is delayed (waited).

At step S8, the quantity n which is indicative of a present address of the memory is incremented by 1 (n=n+1).

At step S9, it is decided whether n is greater than m or not. When the decision at step S9 is "YES", the routine returns to step S2 to newly obtain the additive mean. When the decision at step S9 is "NO", the routine returns to step S3, in order to continue the operation for obtaining the additive mean.

With this calculation, the data to be interpolated is averaged, and stable digital signals are inputted to the interpolation section.

Almost all deviations of the digital data from the A/D converter 1 are comprised of white-noise components. Therefore, by executing sixteen-steps additive mean operation by means of the digital filter, the noise component is reduced to one-sixteenths of the white-noise. Accordingly, the deviation of the data, which has a deviation width of 4 bits, is decreased to a deviation width within 1 bit.

Normally, it is apprehended that a group delay becomes long since a lot of samples are necessary for the execution at the digital filter. However, owing to the progress of digital video cameras for home-use, a high-speed A/D converter which processes video-band range data (up to about 20 Msps) has become comparatively inexpensive. Therefore, by using such an A/D converter, it becomes possible to execute the sixteen-step additive-mean process so that the group-delay is smaller than 1 μsec.

Figure 3:
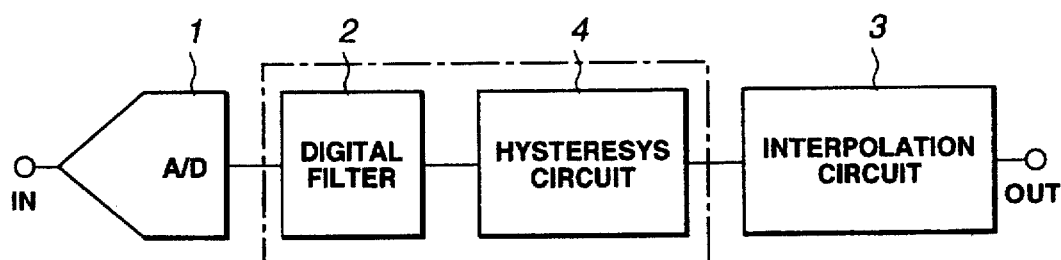
FIG. 3 is a block diagram of a modified example of the interpolation device of FIG. 1.

Although the elimination of noise contained in the output of the A/D converter can be executed by a digital filter, when the data inputted to the A/D converter takes a value which occurs at a change point of a digital value, change of the lowest bit frequently results. This change of the lowest bit can be suppressed by installing a hysteresis circuit. A hysteresis applied by such a hysteresis circuit is not an analog hysteresis obtained by feedback to a comparator, but a digital hysteresis which is applied to the data executed at the A/D converter and the digital filter. This type of hysteresis circuit applied to the interpolation device according to the present invention is shown in FIG. 3.

The analog signal is converted into a digital signal at an A/D converter 1, and the converted digital signal is supplied to a digital filter 2 wherein the high-frequency component of the digital signal is eliminated. The signal processed at the digital filter 2 is supplied to a hysteresis circuit 4. The hysteresis circuit 4 applies a hysteresis characteristic to the digital signal so that the data is outputted as a stable digital signal. Such digital signal is supplied to an interpolation circuit 3 wherein interpolation signals are obtained.

Figure 4:
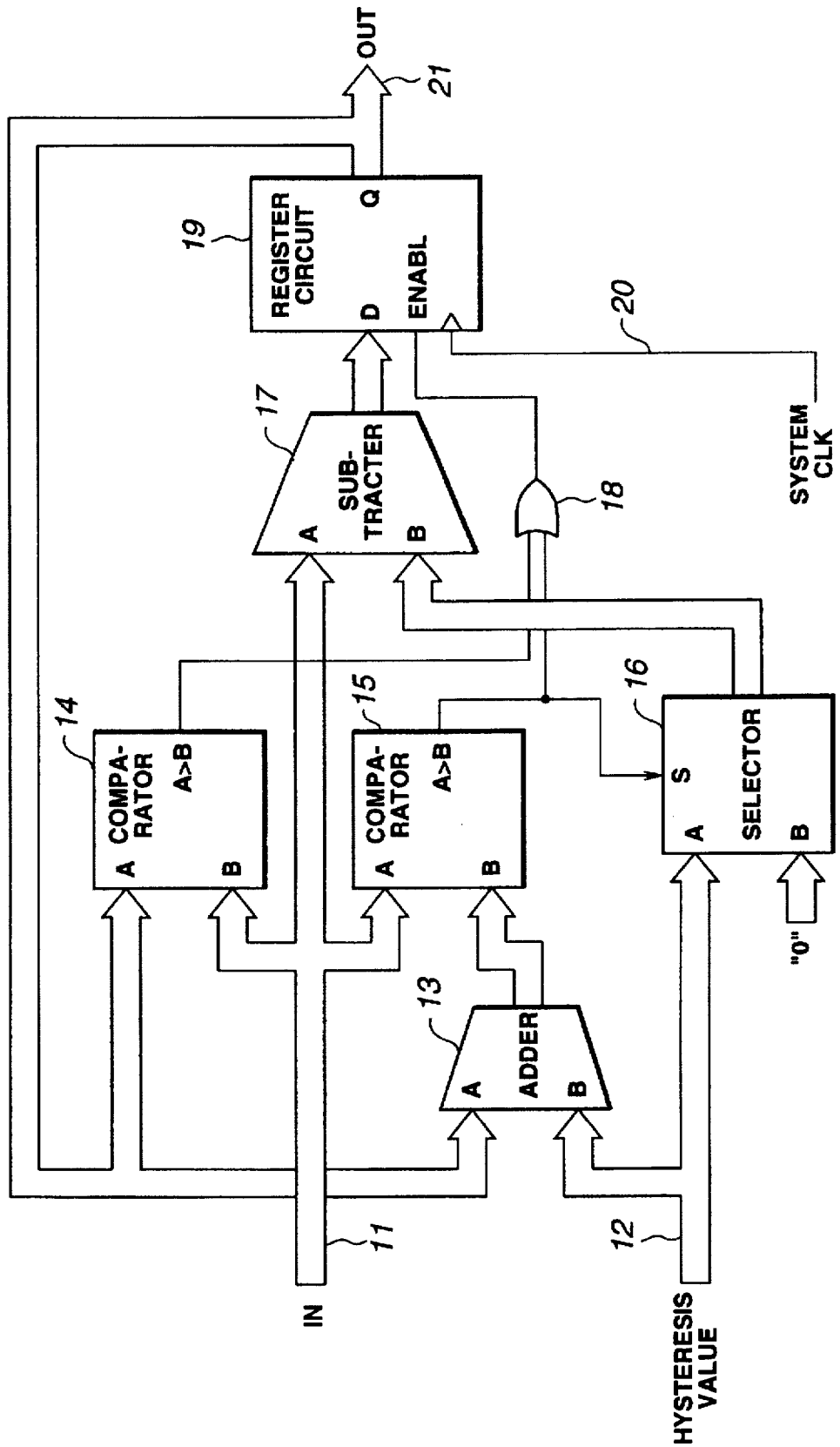
FIG. 4 is a circuit diagram of a hysteresis circuit applied to the interpolation device of FIG. 3.

FIG. 4 shows a typical digital hysteresis circuit. The output of the digital filter is inputted to an input terminal 11. The signal is supplied to an input terminal A of a subtractor 17, an input terminal B of a comparator 14 and an input terminal A of a comparator 15. A hysteresis value is supplied to an input terminal 12. The signal is applied to an input end A of a selector 16 and an input end B of an adder 13. This hysteresis value is determined according to the degree of the rounding of the lower bits. Another input end B of the selector 16 receives "0". When the selector 16 receives a high-signal at a control terminal S from the comparator 15, the input signal A is outputted from the selector 16 to another input B of the subtractor 17. When the selector 16 receives a low-signal at the control terminal S, the zero signal is outputted.

The subtractor 17 obtains a difference between the output of the digital filter 2 and the output of the selector 16. The difference obtained at the subtractor 17 is supplied to a register circuit (flip-flop circuit) 19. The output of the register circuit 19 is treated as an output of the digital hysteresis circuit 4 and inputted to an input end A of the comparator 14 and to an input end A of the adder 13. The comparator 14 executes a comparison between the value stored in the register circuit 19 and the inputted digital signal. When the register stored value is larger than the input digital value (A>B), the comparator 14 outputs 1 as an output logical value to an enable signal port of the register circuit 19 through an OR circuit 18 so that the register circuit 19 stores the output of the subtractor 17. This storage of the output of the subtractor 17 is executed synchronously with the system clock.

When the signal from the register circuit 19 is smaller than the input digital signal, the comparator 14 outputs 0 as a logical value. That is, since the register circuit 19 does not receive an enable signal, the content of the register circuit 19 is not changed.

On the other hand, the output of the register circuit 19 is applied to the input end A of the adder 13. The adder 13 adds the register stored value and the hysteresis value. The result of the adder 13 is applied to an input end B of the comparator 15. The Comparator 15 compares the inputted digital data and the output of the adder 13. When the inputted digital data is larger than the output of the adder 13, the comparator 15 outputs a logic signal 1 as a high-level signal to selector 16 so that the selector 16 outputs a hysteresis value to the subtracter 17.

The subtractor 17 supplies the difference between the inputted digital data and the hysteresis value to the register circuit 19. In this condition, the output logical value of the comparator 15 is set at 1, and the enable signal is applied to the register circuit 19 through the OR circuit 18. Therefore, the digital signal, which is the output of the subtractor 17, is stored in the register circuit 19.

When the input digital signal is smaller than the sum of the register stored value and the hysteresis value, the comparator 15 outputs 0 as an output logical value. Therefore, the register circuit 19 keeps the previous value.

Figure 6:
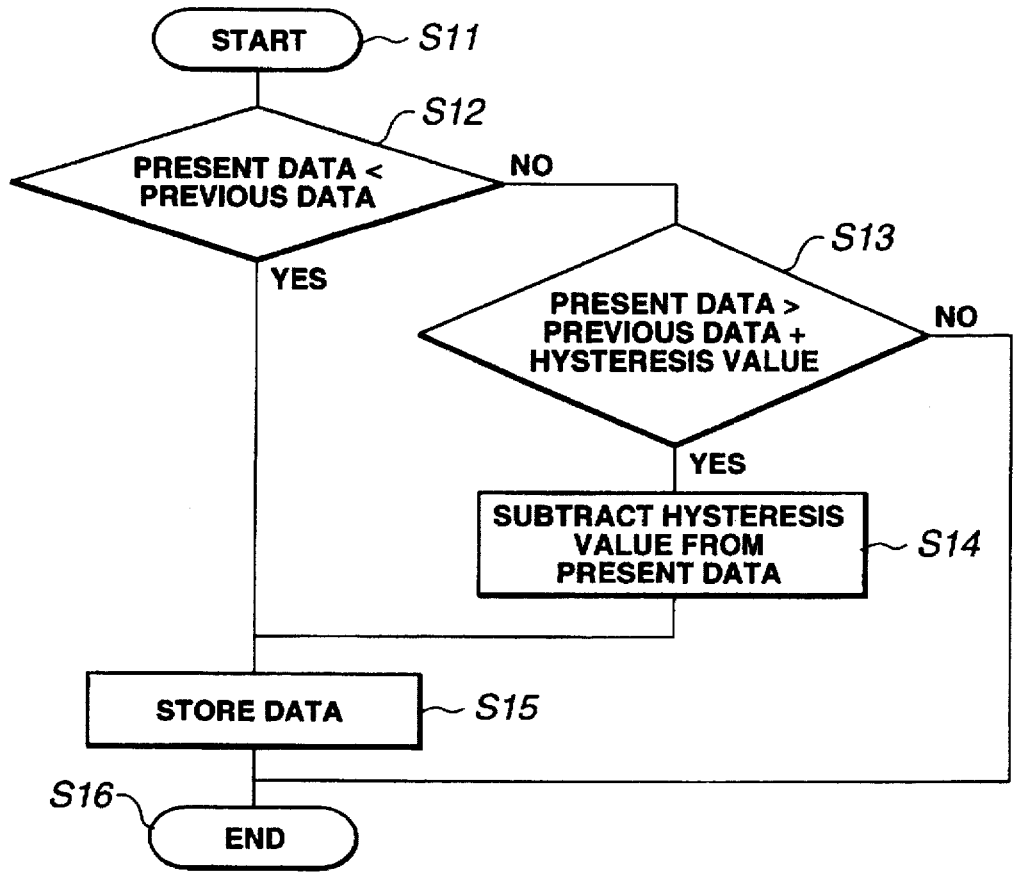
FIG. 6 is a flowchart which shows a method for calculating a hysteresis.

FIG. 6 shows an operation of the digital hysteresis circuit 4 of FIG. 4.

At step S11, the operation of the digital hysteresis circuit 4 is started.

At step S12, it is decided whether the present input data is smaller than the previous input data. When the decision at the step 12 is "YES", routine proceeds to step S15 wherein the present data is stored as new data. Then, the routine proceeds to step S16 wherein the routine ends.

When the decision at step S12 is "NO", the routine proceeds to step S13 wherein it is decided whether the present data is larger than the sum of the previous data and the hysteresis value. When the decision at step S13 is "YES", the routine proceeds to step S14 wherein the present data is decremented by the hysteresis value (present data= present data—hysteresis value). Following this, the routine proceeds to step S15 wherein the present data is stored as new data. When the decision at step S13 is "NO", the routine proceeds to step S16 wherein the routine comes to an end.

This digital hysteresis circuit is arranged so that the present data is compared with the data stored in the register circuit by using a comparator, an adder, a subtractor and a register circuit (flip-flop circuit). When the present data is smaller than the register stored data, the present data is stored in the register circuit as it is. When the present data is larger than the sum of the register stored data and the hysteresis value, the difference between the hysteresis value and the present data is stored in the register circuit. The operation of this hysteresis circuit may be comprised of a program executed by a computer.

Figure 7:
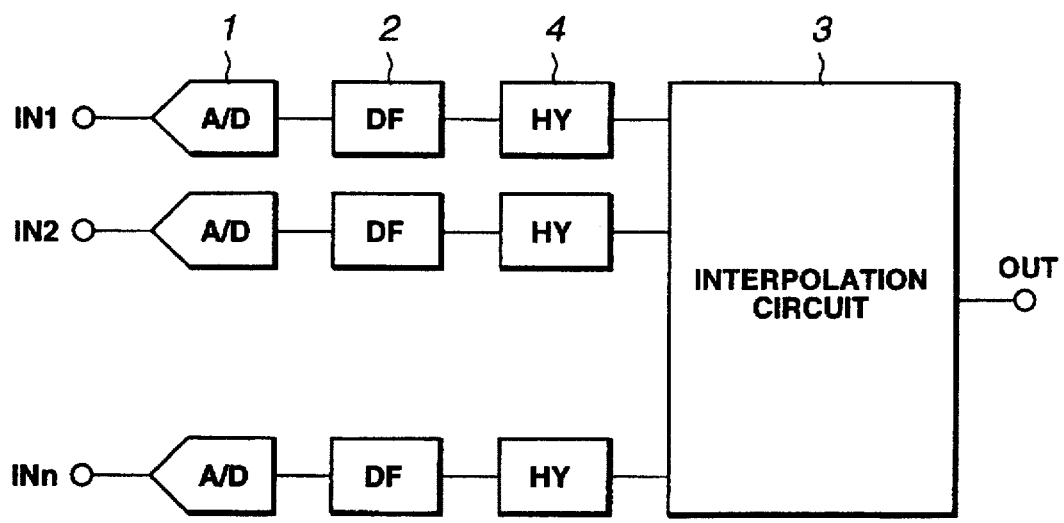
FIG. 7 is a block diagram of a modified example of the first embodiment.

FIG. 7 shows a modified example of the first embodiment of the interpolation device for multi-phase signals in accordance with the present invention. As shown in FIG. 7, the multi-phase signals are A/D converted by a plurality of A/D converters 1 by the phase signal (IN1, IN2, —, INn). The A/D converted signals are processed by the respective digital filters 2 and the respective hysteresis circuits 4, as mentioned above. Then, the processed signals are inputted to the interpolation circuit 3.

Figure 8:
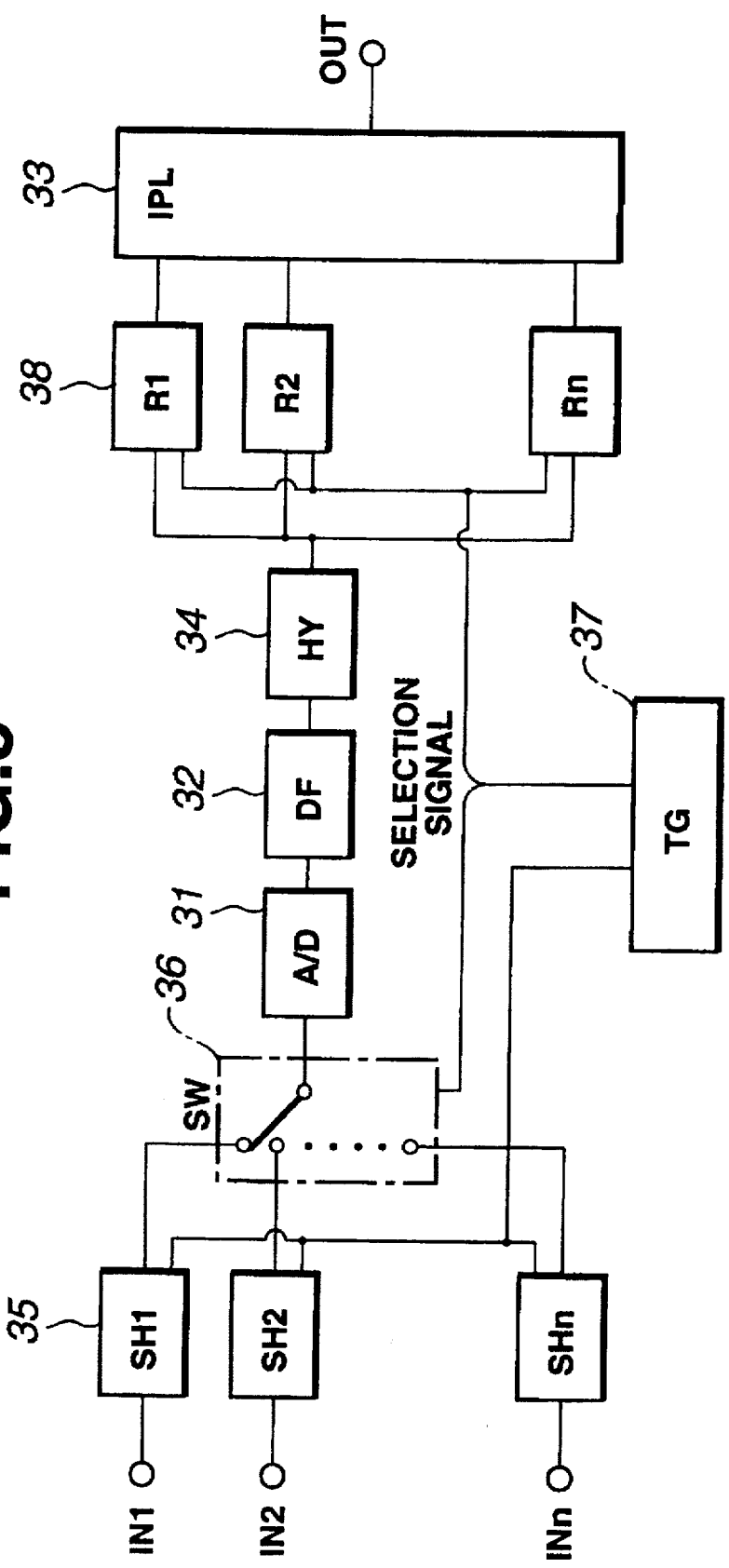
FIG. 8 is a block diagram of a modified example of the first embodiment.

FIG. 8 shows another modified example of the first embodiment of the interpolation device for processing multi-phase signals in accordance with the present invention. In this example, an A/D converter, a digital filter and a hysteresis circuit are used in common for each phase signal of the multi-phase signals. As shown in FIG. 8, each signal is inputted and kept at a sample-and-hold circuit (SH1, SH2, —SHn) 35. A timing-signal generator (TG) 37 controls the connection between each sample-and-hold circuit 35 and the A/D converter 31 by a switch 36. The contents in the sample-and-hold circuits 35 are, in turn, supplied to the A/D converter 31. Then, the A/D converted data are in turn supplied to the digital filter 32 for eliminating a high-frequency component of each data. The filtered data are supplied to corresponding registers (R1 to Rn) 38. The stored data are supplied to the interpolation circuit 33 in parallel.

Referring to FIGS. 9 to 25, there is shown a second embodiment of an interpolation device according to the present invention.

Figures 9, 10:
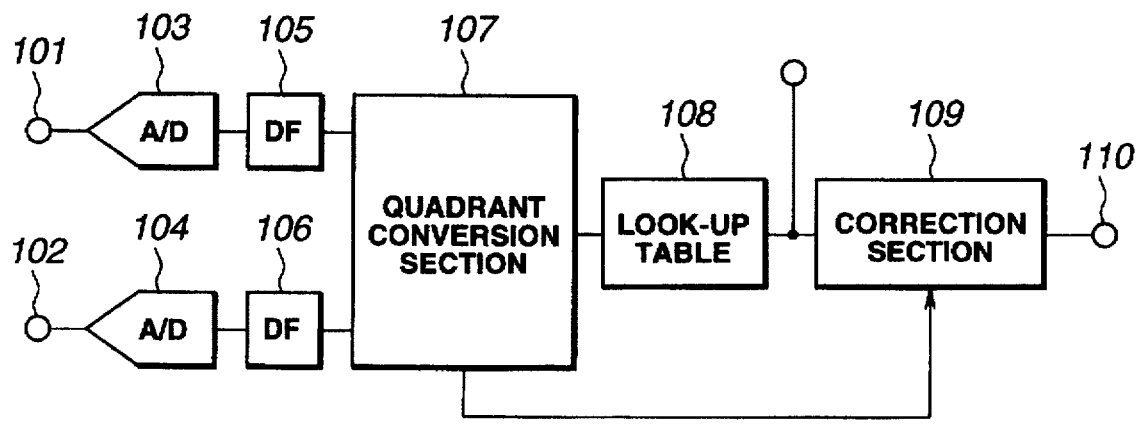
FIG. 9 is a block diagram of a second embodiment of the interpolation device according to the present invention.
FIG. 10 is a table which shows a signal correction rule between phase A and phase B of the fifth embodiment.

As shown in FIG. 9, a pair of input signals are inputted from input terminals 101 and 102 to A/D converters 103 and 104 respectively. The digitized data are supplied to digital filters 105 and 106 wherein high-frequency components of the respective converted digital signal are eliminated, that is, the several lower bits of the digital data are rounded (rounded up or rounded down). Then, the rounded digital data is inputted to a quadrant conversion section 107 where the quadrant on the x-y coordinate of each digitized data is searched in order to decrease a data volume of a look-up table 108. That is, by taking into account the changing direction of the data in each quadrant, the look-up table 108 for one quadrant is applied to other data in other quadrants. In a correction section 109, such correction of the data obtained at the look-up table 108 is corrected according to the quadrant position of the inputted signals from the quadrant conversion section 107.

Analog signals outputted from an encoder are periodic signals which are shifted in phase by 90° and form a relationship of a sine wave and a cosine wave. The amplitude of each analog signal is digitized through an A/D converter. The digitized data is inputted to a ROM in the form of the look-up table 108 of the data and the lower and upper address. Therefore, by using this look-up table, the interpolation of the data is executed.

Figure 14:
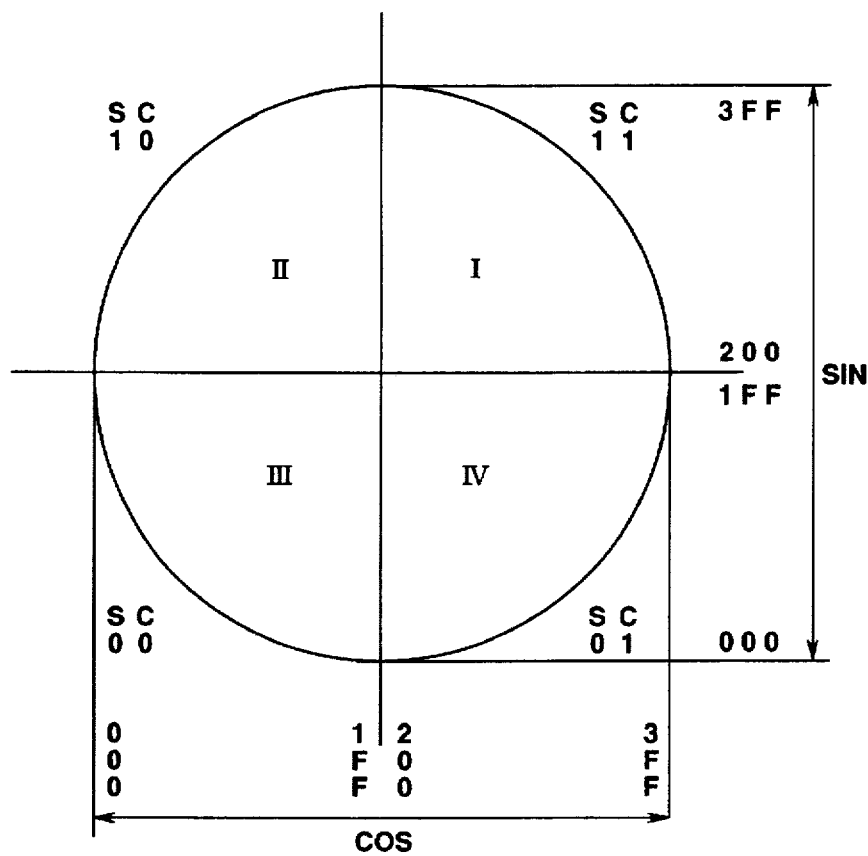
FIG. 14 is an expla. natory view of a Lissajous figure which is formed when the amplitudes of the signals before interpolation are disposed on the x-y plane.

As shown in FIG. 14, assuming that the horizontal axis is the x-axis, the vertical axis is the y-axis, a circle around the origin point of the x-y coordinate is formed to have a radius r, and the rotation angle is ω, then the above mentioned sine and cosine waves have a relationship with the x-y coordinate as follows:

y=r sin ω+
X=r cos ω+

In FIG. 14, numerals I, II, III and IV represent first to fourth quadrants, respectively. Quadrant is axially symmetric with quadrant IV as to the x-axis. Quadrant II is axially symmetric with quadrant III as to the x-axis. Therefore, the pair of data units of the corresponding quadrants take the same values at to x value. Similarly, quadrant I is axially symmetric with quadrant II as to the y-axis. Quadrant IV is respectively symmetric with quadrant III as to the y-axis. Therefore, the pair of data units of the corresponding quadrants take the same values as to the y value.

As shown in FIG. 14, x values of quadrant II and quadrant III are defined to be within 000 to 1FF, the x values of quadrant I and quadrant IV are defined to be within 200 to 3FF, the y values of quadrant IV and quadrant III are defined within 000 to 1FF, and the y values of quadrant I and the quadrant II are defined to be within 200 to 3FF.

Comparing the x, y values in quadrant I with the x, y values in quadrant II, y values of the quadrant I and quadrant II take 200 to 3FF, x values of quadrant I take 200 to 3FF, and x values of quadrant II take 000 to 1FF. Therefore, except for the most significant bit, the other bits take the same values in both quadrant I and quadrant II. This indicates that it is possible to permutate the data of quadrant II by the data of quadrant I.

Figure 15:
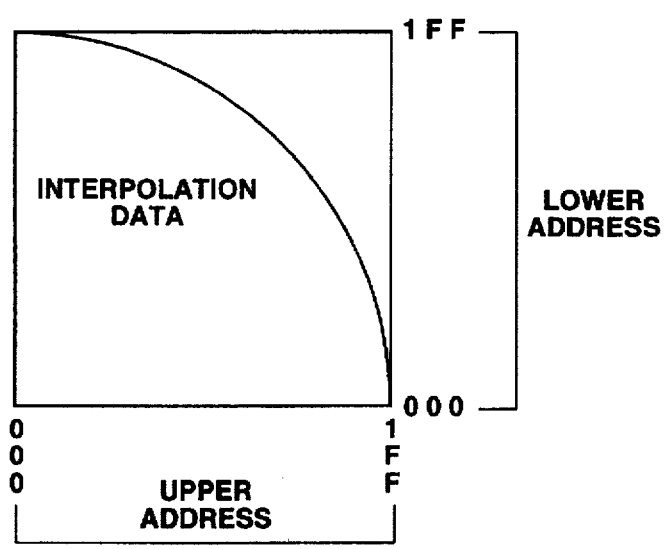
FIG. 15 is an explanatory view of interpolation data stored in a memory of the interpolation device of FIG. 9.

Further, in quadrant III, x values take 000 to 1FF and y values take 000 to 1FF. In quadrant IV, x values take 200 to 3FF and y values take 000 to 1FF. Accordingly, it is possible to permutate such data of the quadrant III and the quadrant IV by the data in quadrant I. FIG. 15 shows a digital data unit of a representative quadrant. The quadrant shown in FIG. 15 is formed so that the address values are arranged to increase from left to right and from lower to upper in the drawing. This can be directly applied to the data in quadrant I. As to the data in quadrant II, this data stored in the ROM is not directly applied. It is necessary to execute a conversion of the data as shown in FIGS. 18A to 18D.

Figure 18A:
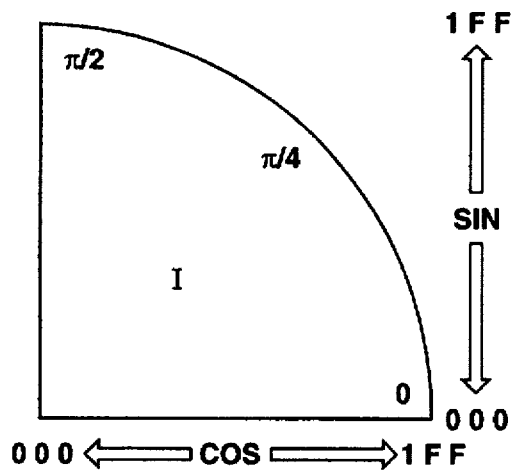
FIGS. 18A to 18D are views for explaining the relationship among the quadrants.
Figure 18B:
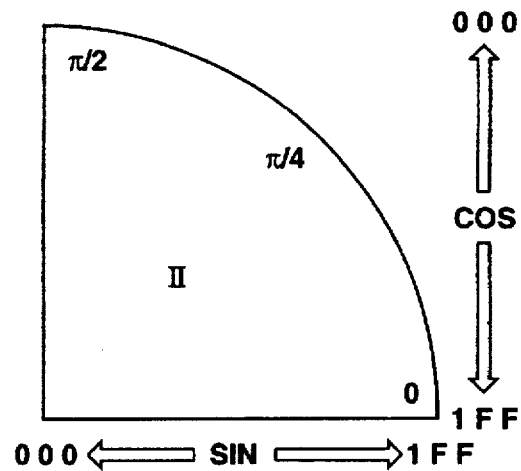
Figure 18C:
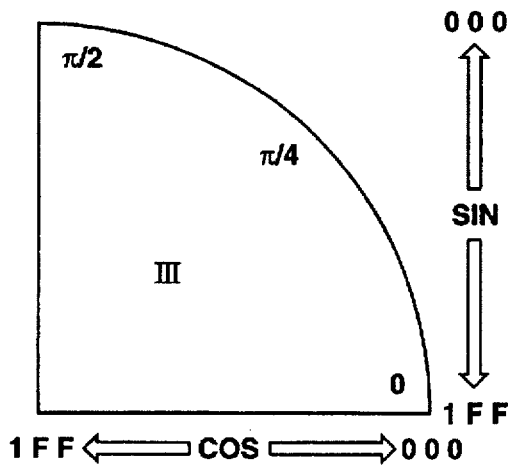

FIG. 18A shows base data stored in the ROM. Since it is assumed that the base data stored in the ROM is for quadrant I, ½π rotated data of quadrant II are equivalent with those of quadrant I. Therefore, the data of quadrant II may be represented as shown in FIG. 18B. Herein, since the vertical axis is arranged so that the number is increased from upper to lower, it is necessary to invert these data. Although in FIG. 18A the horizontal axis corresponds to cosine and the vertical axis corresponds to sine, in FIG. 18B the horizontal axis corresponds to sine and the vertical axis corresponds to cosine. Therefore, it is necessary to replace these axes. Since a 180° rotated quadrant III is equivalent with quadrant I, quadrant III is represented as shown in FIG. 18C. However, the increasing directions of both of the x-axis and the y-axis are the inverse of those of the quadrant I.

Figure 18D:
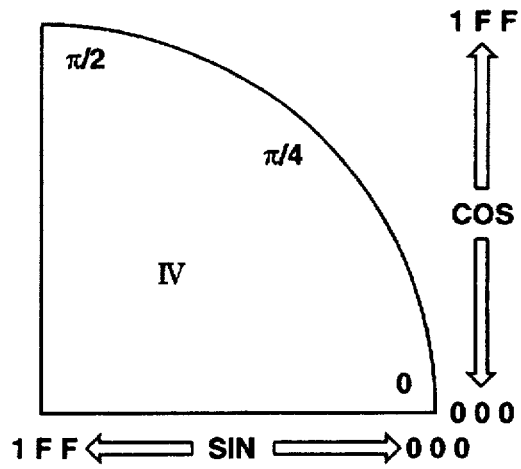

A 270° rotated quadrant IV is equivalent with quadrant I except that the increasing direction of the horizontal axis of FIG. 18D is the inverse of that of FIG. 18A. Accordingly, it is necessary to inverse this direction. In addition, although FIG. 18A shows that the horizontal axis is cosine and the vertical axis is sine, FIG. 18D shows that the horizontal axis is sine and the vertical axis is cosine. Further, it is necessary to distinguish four quadrants from the uppermost bit of the address bits.

FIG. 11 shows remkrking points for the conversion. In table 1 of FIG. 11, sc denotes the most significant bit of sine signal and cosine signal which are represented by 11, 10, 00 and 01 corresponding to quadrants I to IV. In the address blocks, lined sin and cos, namely, $\overline{\sin}$ and $\overline{\cos}$, represent complement values (number).

As a method for substituting the interpolation data of sine and cosine waves for one-cycle (360°) by data for ¼ cycle (90°), for example, considering the Lissajous figure formed on the x-y plane by the data of sine and cosine waves whose data length is 10 bits, in order to represent the four quadrants by quadrant I on the Lissajous figure, the data except for the most significant bit is changed according to the most significant bit of the data of the sine and cosine waves so that the address changing direction of the other quadrants corresponds to that of quadrant 1. More particularly, when the most significant bit is 0, the data except for the most significant bit is inverted. This also occurs when the data of the sine and cosine waves of the even numbered quadrant are exchanged with each other.

Since the data length is 10 bits, that is a 10 character binary number which can be represented as 000 to 3FF in hexadicimal form, the replacement is executed according to the condition of the most significant bit while the lower 9 bits are inverted. Further, FIG. 11 shows a truth table of this embodiment. The relationship among the interpolation data of a look-up table stored in the ROM, the lower address and the upper address are represented by the following equations.

Interpolation data=arctan (lower address/upper address) · interpolation number/2π, wherein lower address ≧ upper address.

Interpolation data=interpolation number/4—arctan (upper address/lower address)·interpolation number/2, wherein lower address<upper address.

The same occurs where the x-axis denotes the upper address and the y-axis denotes the lower address. It will be understood that the relation between the axis and address may inverted.

Figure 19:
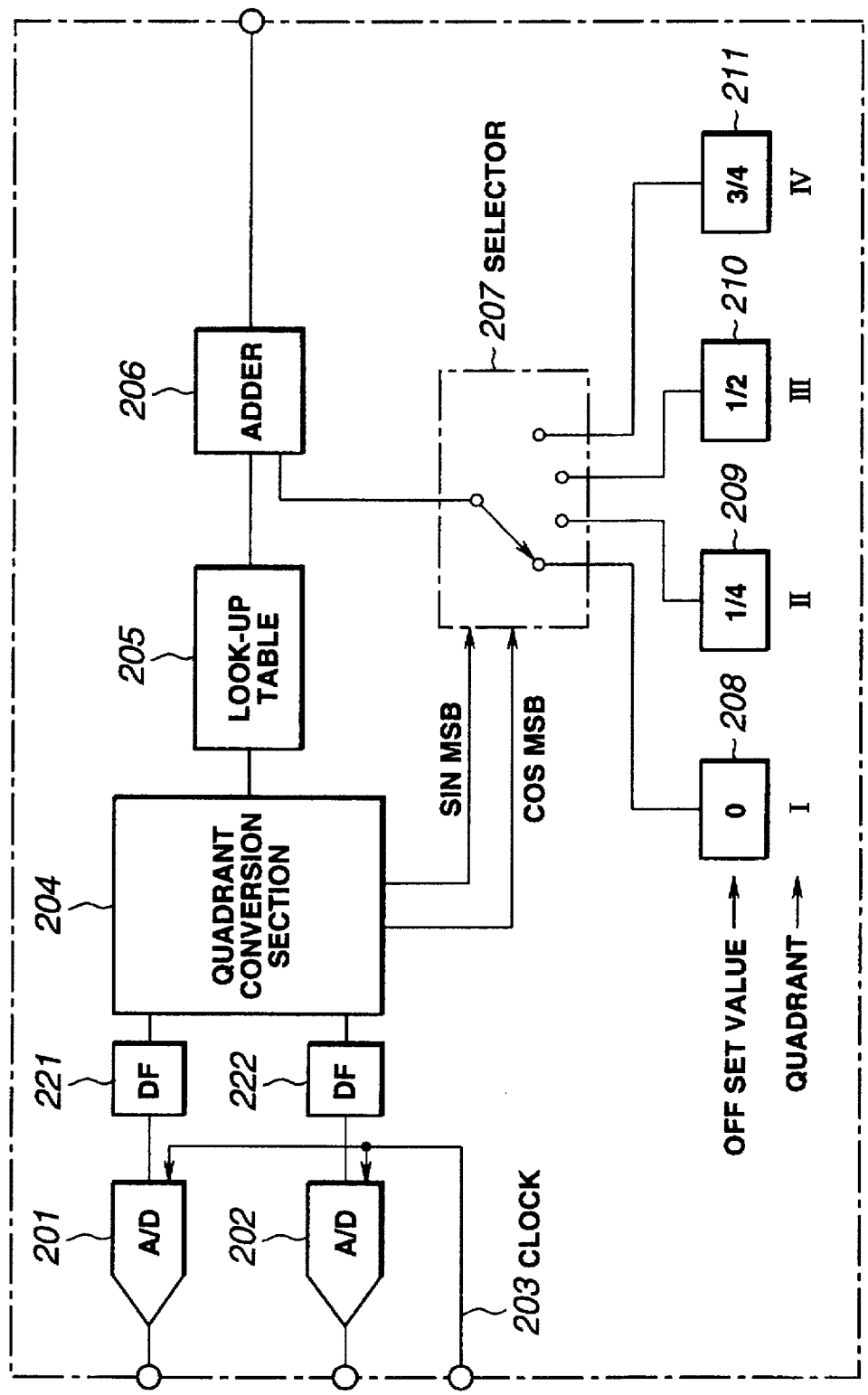
FIG. 19 is a block diagram of a modified example of the second embodiment.

FIG. 19 shows a modified example of the second embodiment of the interpolation device. In this circuit, the sine signal and cosine signal are inputted to A/D converters 201 and 202 from a sensor (not shown). The A/D converters 201 and 202 convert the received analog signals into digital signals according to a sampling signal from a clock 203, and output to digital filters 221 and 222 wherein high-frequency components of the respective converted digital signals are eliminated, that is, the several lower bits of the digital data are rounded (rounded up or rounded down). Then, the rounded digital data is inputted to a quadrant conversion section 204.

The quadrant conversion section 204 generates a distinguish signal for disti.nguishing the quadrant of the input signal from the uppermost bit of the input signal, and sends the distinguish signal to an offset selector 207. Further, the quadrant converter 204 generates an address signal corresponding to the data in the quadrant I from the absolute value of the sin and cos signals, and supplies it to a look-up table 205 as an address signal of the look-up table 205.

The look-up table 205 stores interpolation data and outputs a selected data according to the commanded address. Corresponding to the above-mentioned quadrant, first to fourth memory units 208 to 211 respectively store an offset value of the quadrant I, an offset value of the quadrant II, an offset value of the quadrant III, an offset value of the quadrant IV. The first to fourth memory units 208 to 211 are connected to the offset selector 207 so that one of the memory unit is selected according to the command of the selector 207.

The offset value of the first to fourth quadrants is selected such that quadrant I is 0, quadrant II is ¼, quadrant III is ½ and the quadrant IV is ¾. The selected offset value is added to the data selected at the look-up table 205 in an adder 206. The calculated data is outputted as position data.

Figure 20:
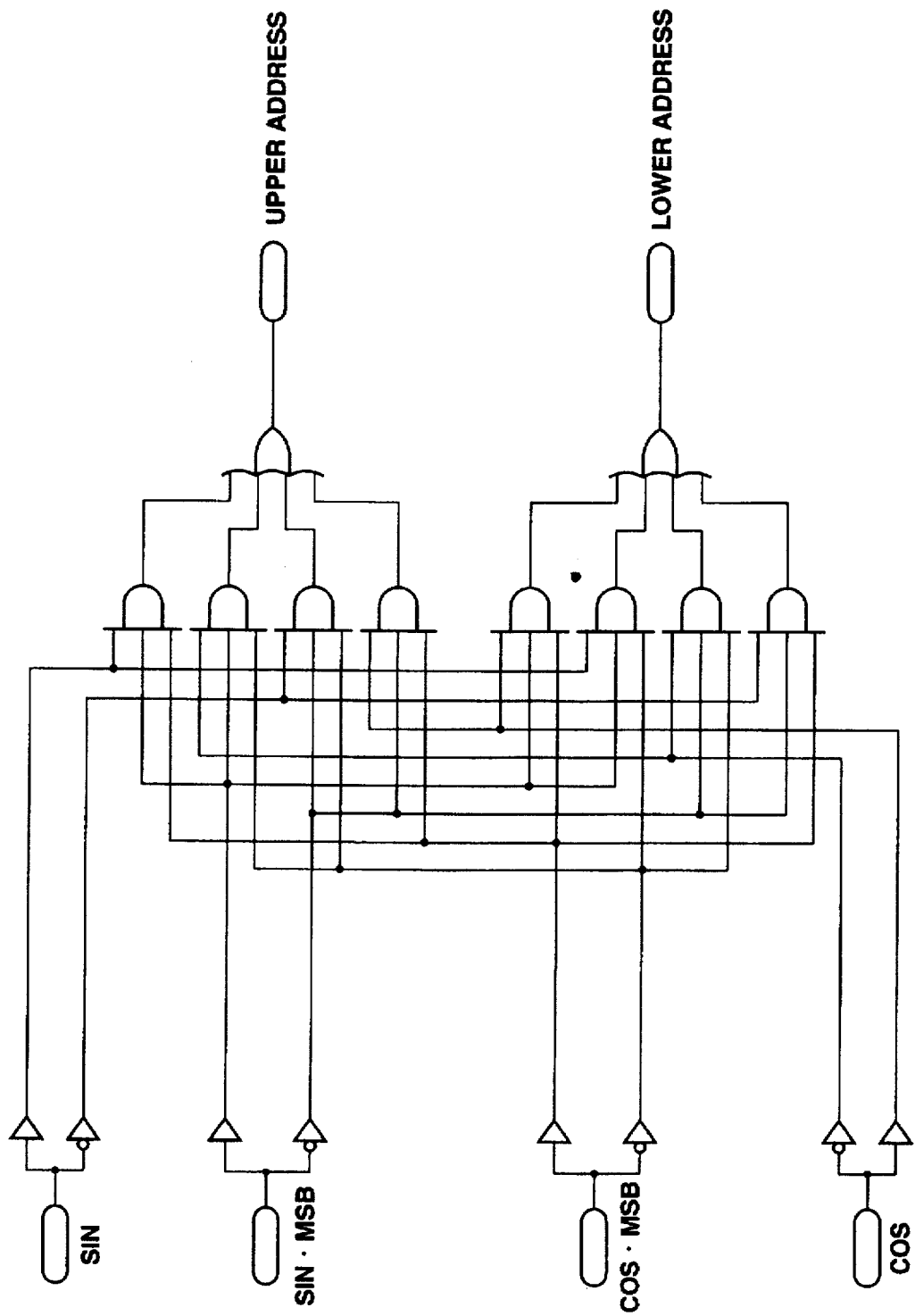
FIG. 20 is a circuit diagram which shows a quadrant conversion circuit of FIG. 19.

FIG. 20 shows a circuit diagram of the quadrant conversion section 204 of FIG. 19. Binary signals outputted from the A/D converter corresponding to the amplitude of the sine wave and the cosine wave from the displacement detector are inputted to the quadrant conversion section 204. Although in this figure one input terminal is denoted by each of sine and cosine, practically nine terminals are provided for each sine and cosine signals. The inverter outputs a logical value 0 when the corresponding bit indicates 1. When the corresponding bit indicates 0, the inverter outputs a logical value 1. AND is a conjunction circuit, OR is a disjunction circuit. This circuit outputs a truth value shown in FIG. 11.

Figure 22:
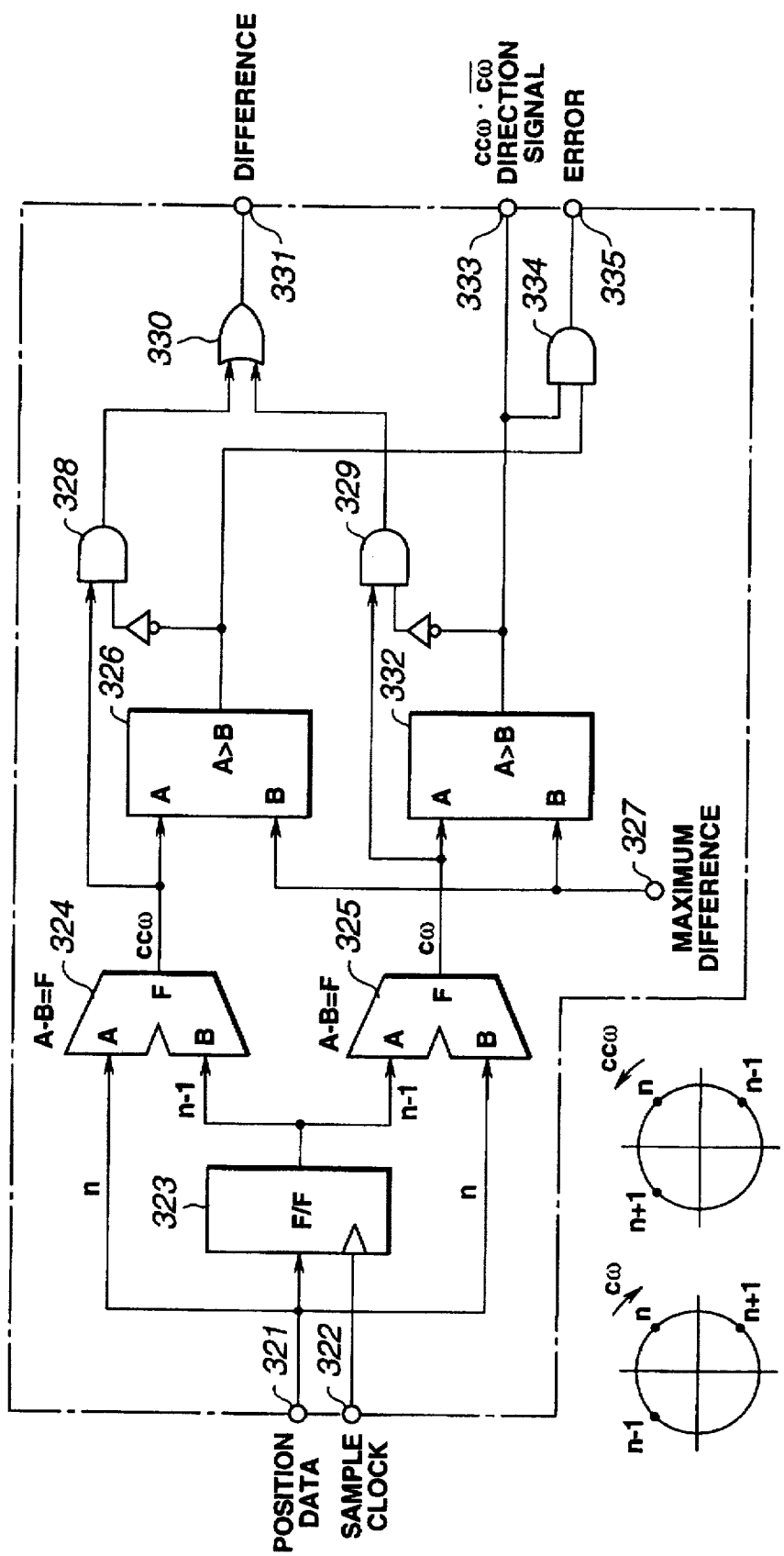
FIG. 22 is a circuit diagram which shows a difference value converter.

FIG. 22 shows a circuit diagram which outputs a difference value which is obtained by storing data for one cycle of the output of the interpolation circuit and the output of the adder and by subtracting each of them from the previous sampled data.

This circuit for obtaining a difference value receives data from the output side of the interpolation circuit of FIG. 19. In this circuit, the input position data is supplied to an input terminal 321 and supplied to a flip-flop circuit (F/F) 323 according to a sampling clock inputted from a terminal 322. Accordingly, the output of the flip-flop circuit 323 represents data obtained in a previous sampling time.

A difference between the present data and the previous data is obtained at a subtractor 324. The difference value, indicative of a difference of anticlockwise movement on the Lissajous figure, is outputted. Similarly, a difference between the present data and the previous data is obtained at a subtractor 325. The difference value, indicative of a difference of clockwise movement on the Lissajous figure, is outputted. The output of the subtractor 324 is inputted to an input end of a comparator 326 wherein the input difference signal is compared with a maximum difference signal inputted from another input end of the comparator 326. When it is decided that the input difference signal is larger than the maximum difference, the comparator 326 outputs a high-level signal so as to turn on one input end of an AND circuit 334. The AND circuit 334 outputs an error signal when a high-level signal is inputted to one of its input ends.

Similarly, the output of the subtractor 325 is inputted to an input end of a comparator 332 wherein the input difference signal is compared with a maximum difference. When it is decided that the input difference signal is larger than the maximum difference, the comparator 332 outputs a high-level signal to the AND circuit 334.

If the difference signal is not larger than the maximum difference, the output level of the comparators 326 and 332 are set at low level. Therefore, the output of AND circuits 328 and 329 are turned on, and the difference value is outputted from an OR circuit 330. At this time, the output of the comparator 332 is a difference of a clockwise direction. Therefore, by outputting the difference, the indication of the direction is executed.

Figure 25:
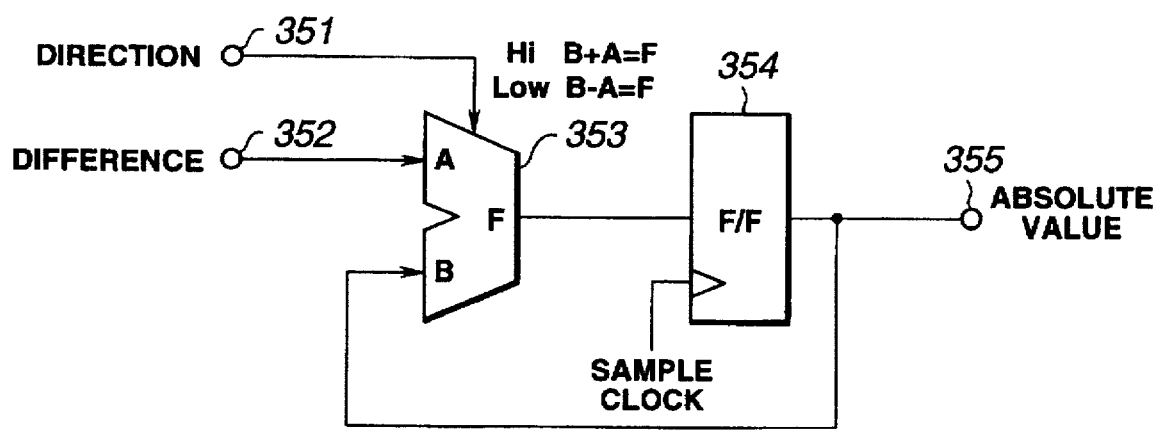
FIG. 25 is a circuit diagram which shows a circuit for outputting an absolute value upon accumulated adding of the difference values.

It will be understood that an absolute value of an encoder is obtained by the accumulated sum of the output of the difference value conversion circuit. FIG. 25 shows an example of an accumulated adder applicable to this case. As shown in FIG. 25, according to the direction signal inputted to an input terminal 351, the difference signal from the difference conversion circuit is inputted from the difference converter to an adder 353 so as to be added with the previous value. Therefore, the absolute value of the encoder is outputted to an output end 355.

Figure 23:
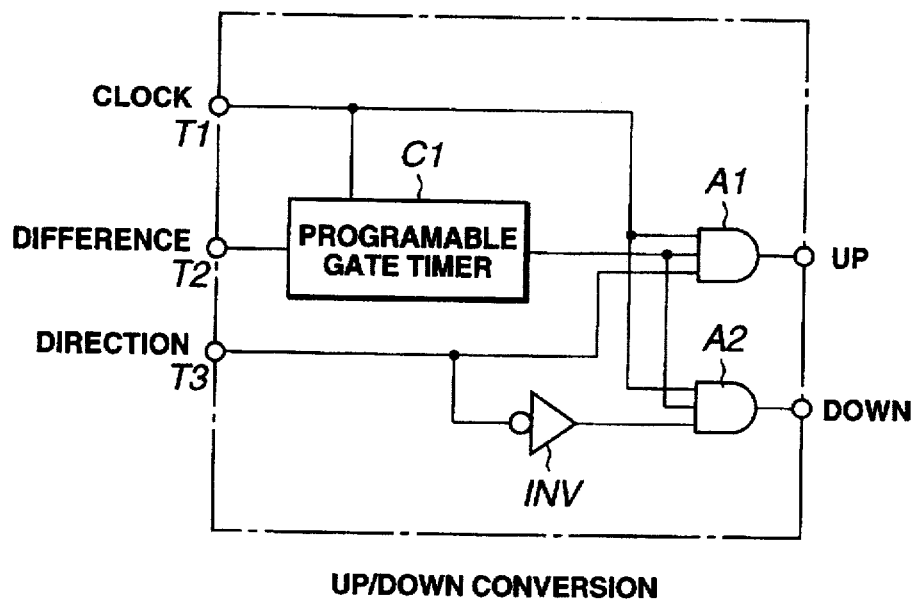
FIG. 23 is a circuit diagram which shows an UP/DOWN converter.

FIG. 23 shows an UP/DOWN conversion circuit for obtaining A/B phase by inputting the difference value to a programmable timer. The difference value inputted to an input terminal T2 is supplied to a programmable gate timer C1 which in the difference signal is converted into a on and off signal according to a clock signal from a standard oscillator. The output of the programmable gate timer is applied to AND circuits A1 and A2. The direction signal is applied from an input terminal T3 to the AND circuit A1. An inverted value of the direction signal is applied to the AND circuit A2. Therefore, a clock signal for counting UP is outputted from an output end of the AND circuit A1, and a clock signal for counting DOWN is outputted from an output end of the AND circuit A2.

Figure 24:
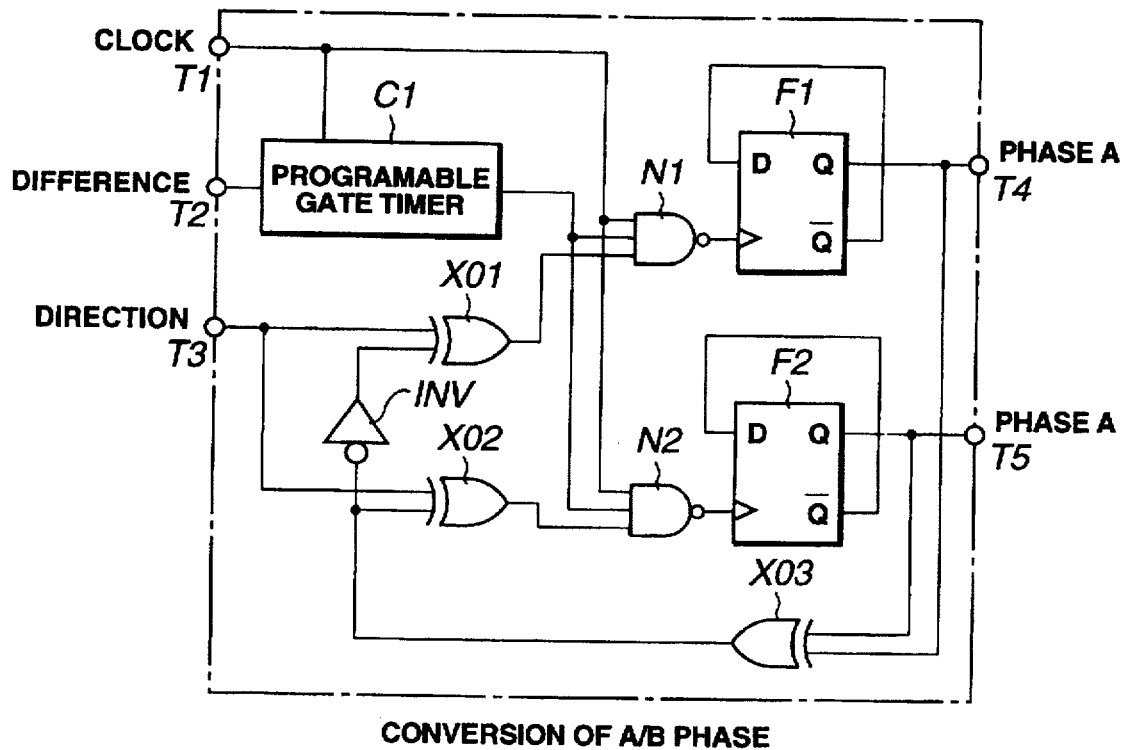
FIG. 24 is a circuit diagram which shows an A/B phase converter.

FIG. 24 shows an A/B phase conversion circuit for obtaining A/B phase output by inputting the difference value to a programmable timer. When flip-flop circuits F1 and F2 output logical value 0, the output of an exclusive OR circuit XO3 is 0. Accordingly, an input of an exclusive OR circuit XO1 is 1. If the input signal to a terminal T3 is 0, an output of an exclusive OR circuit XO1 becomes 1. Therefore, the clock signal is supplied to the flip-flop circuit F2 through the NAND circuit N1 while the gate signal is kept at 1.

The flip-flop circuit F1 is turned on according to the output of the NAND circuit N1, and the logical value 1 is outputted to its output end Q. The exclusive OR circuit XO3 outputs 1, and the input to the exclusive OR circuit XO1 becomes 0. Therefore, the output of the exclusive OR circuit XO1 becomes 0, and the gate constructed by the NAND circuit N1 is closed. Further, the output of the exclusive circuit XO2 becomes 1 and the gate constructed by the NAND circuit N2 is opened to supply a clock signal to the flip-flop circuit F2.

When the flip-flop circuit F2 is turned on, the output of the exclusive OR circuit XO3 becomes 0. Therefore, the NAND circuit N1 is again opened and the NAND circuit N2 is closed. When the NAND circuit N1 is opened, a clock signal is supplied to the flip-flop circuit F1. Therefore, the flip-flop circuit F1 is inverted and the logical value is set at 0. The output of the exclusive OR circuit XO3 is set at 1, and therefore the NAND circuit N1 is again closed and the NAND circuit N2 is opened. Therefore, the flip-flop circuit F2 outputs a logical value 0 and is returned to start.

The above-mentioned operation is executed when the gate signal is 1. When the direction signal is 1, the flip-flop circuit F2 is first opened and then the flip-flop circuit F1 is next opened. When the direction signal is 0, the flip-flop circuit F1 is first opened and then the flip-flop circuit F2 is next opened.

When the gate signal is 0, both of the flip-flop circuits F1 and F2 are closed. Therefore, the flip-flop circuits F1 and F2 keep the previous condition.

Furthermore, if the output is A/B phase data, interpolation data in the look-up table can be provided by converting the lower 2 bits of the obtained data into the Gray code. If the number of the interpolation is a multiple of 16, its 2 bits may be outputted as it is as A/B phase. That is, the correction circuit 107 may be omitted from the circuit in FIG. 9.

However, this method is theoretically concluded only in a case that the number of the interpolation data is the number 4. Because the value of A/B phase is four values (00, 01, 10, 11) and therefore if the start of a cycle is 0, it is necessary that the end of the cycle must be 3.

Figure 21:
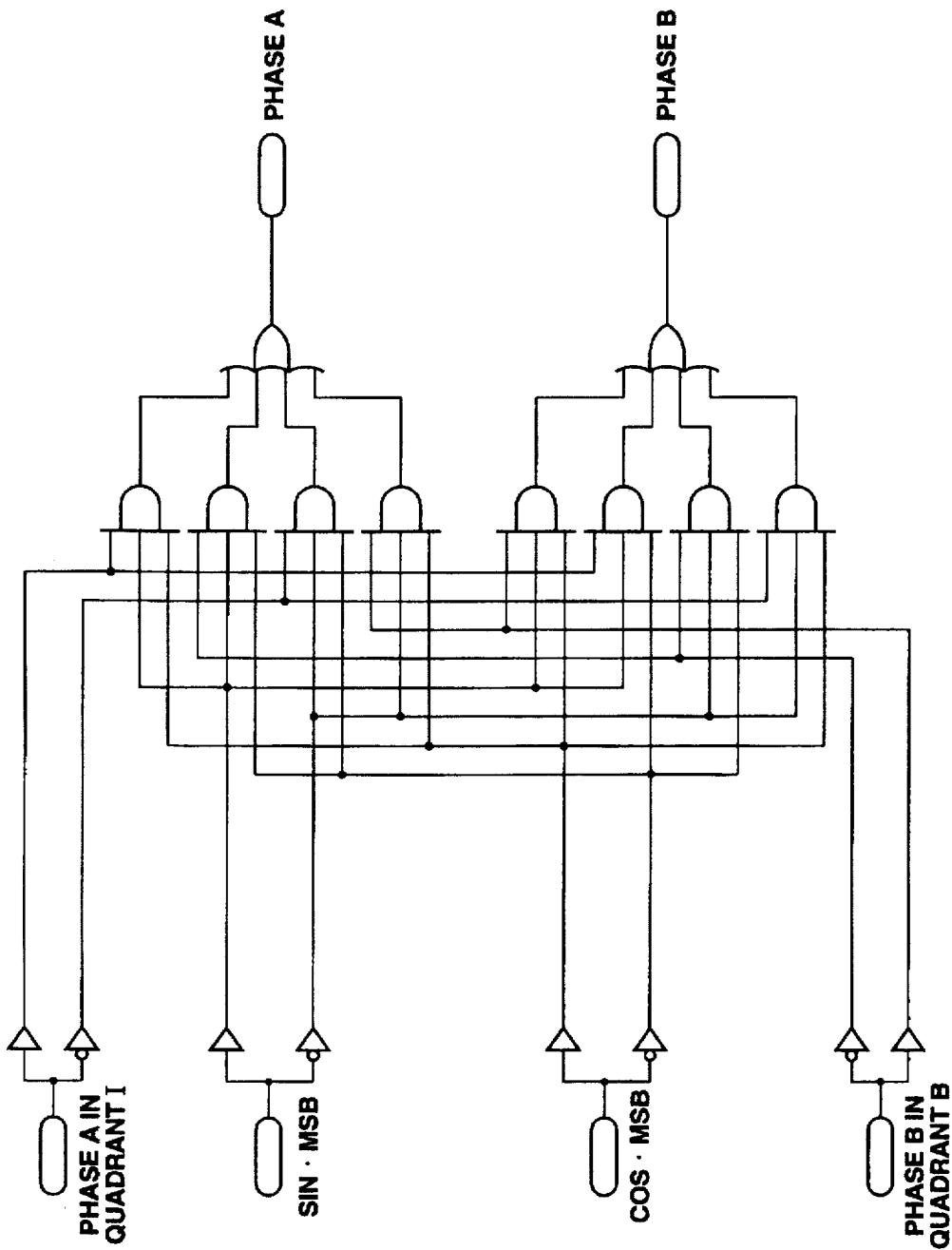
FIG. 21 is a circuit diagram which shows a correction circuit for phase A and phase B data from the look-up table.

Furthermore, since the look-up table for interpolation is comprised of one-fourth of one cycle data, it follows that if the start of the first quarter cycle is 0 the end of the fourth quarter cycle must be 3. Therefore, the number of the interpolation data must be a multiple of 16. However, if the number of the interpolation to be executed is an odd multiple of 8 or an odd multiple of 4, it is easy to execute such interpolation by applying a correction as shown in FIG. 10. In FIG. 10, A denotes a signal of phase A, B denotes a signal of phase B, "a" denotes an interpolation signal of phase A in the quadrant I, and "b" denotes an interpolation signal of phase B in the quadrant I. Further, 16n, 8(2n−1) and 4(2n−1) denote that the number of the interpolation is respectively a multiple of 16, an odd multiple of 8 and an odd multiple of 4. The "a" and "b" above which a line is provided indicate an inverse number (complement). FIG. 21 shows a circuit for executing the interpolation data whose number is an odd multiple of 4. This circuit executes conversion so as to satisfy the truth table of FIG. 10.

Figure 12:
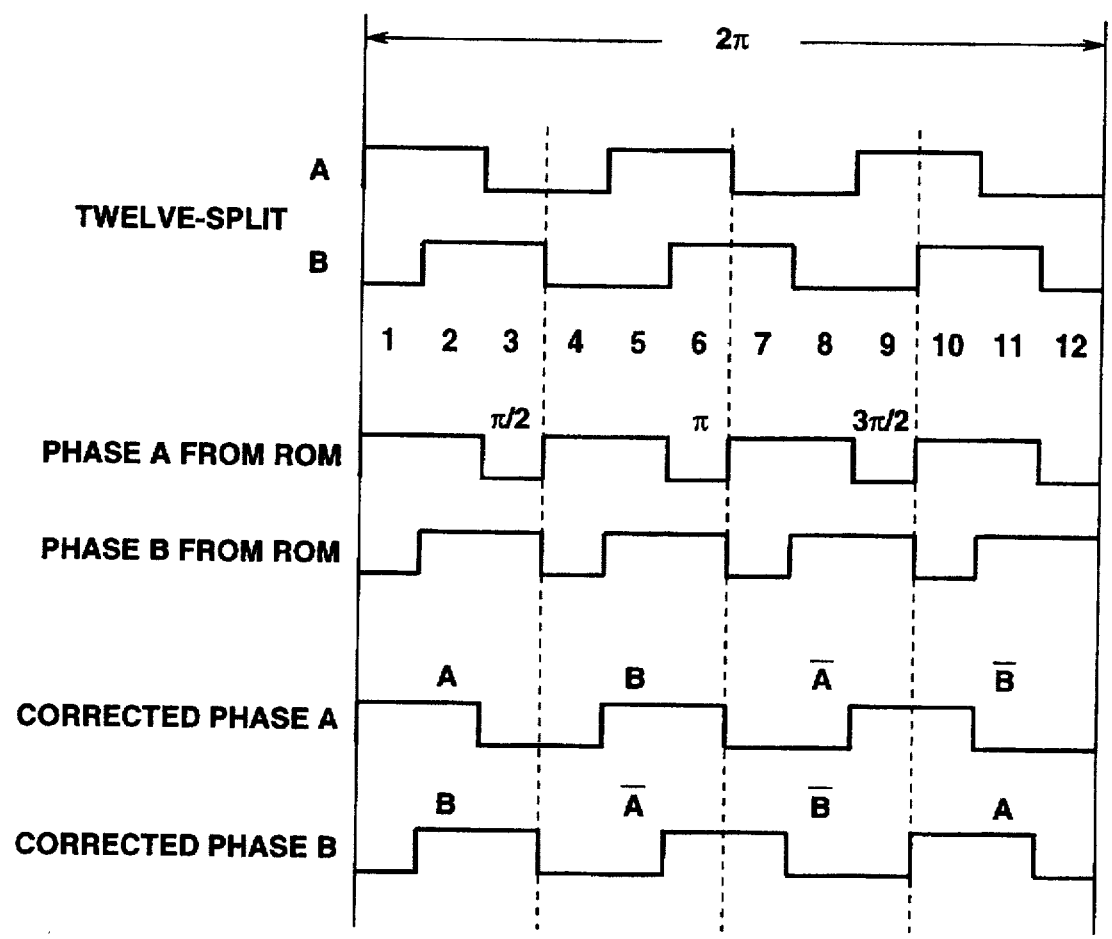
FIG. 12 is a wave form graph for explaining an interpolation method for executing an interpolation by dividing one-cycle into an odd multiple of 4.

FIG. 12 shows a wave form graph for explaining the above mentioned contents the case where the number of interpolation is an odd multiple of 4 (12 distribution 4×3= 12). The upper two waves show desired wave forms of phase A and phase B. The intermediate two waves show wave forms read from the ROM for the look-up table. The lower waves show corrected waves of phase A and phase B. The lower two waves shown in FIG. 12 are comprises of first to fourth sections divided by a broken line. In the first section positioned at the left hand side on FIG. 12, the sine and cosine waves are represented by data from the look-up table as it is. In the second section, the phase A signal is replaced by the previous phase B signal, and the phase B signal is replaced by the inverted value of the previous phase A signal. In the third section, the phase A signal is replaced by the phase B signal at the second section, that is, by the inverted value of the phase A signal at the first section, and the phase B signal is replaced by the inverted value of the previous phase A signal. In the fourth section positioned at the right hand side, the phase A signal is replaced by the inverted value of the previous phase B signal, and the phase B signal is replaced by the inverted value of the previous phase A signal.

With these corrections of the signals, a desired wave form, which indicates a 50% duty, is obtained.

Figure 13:
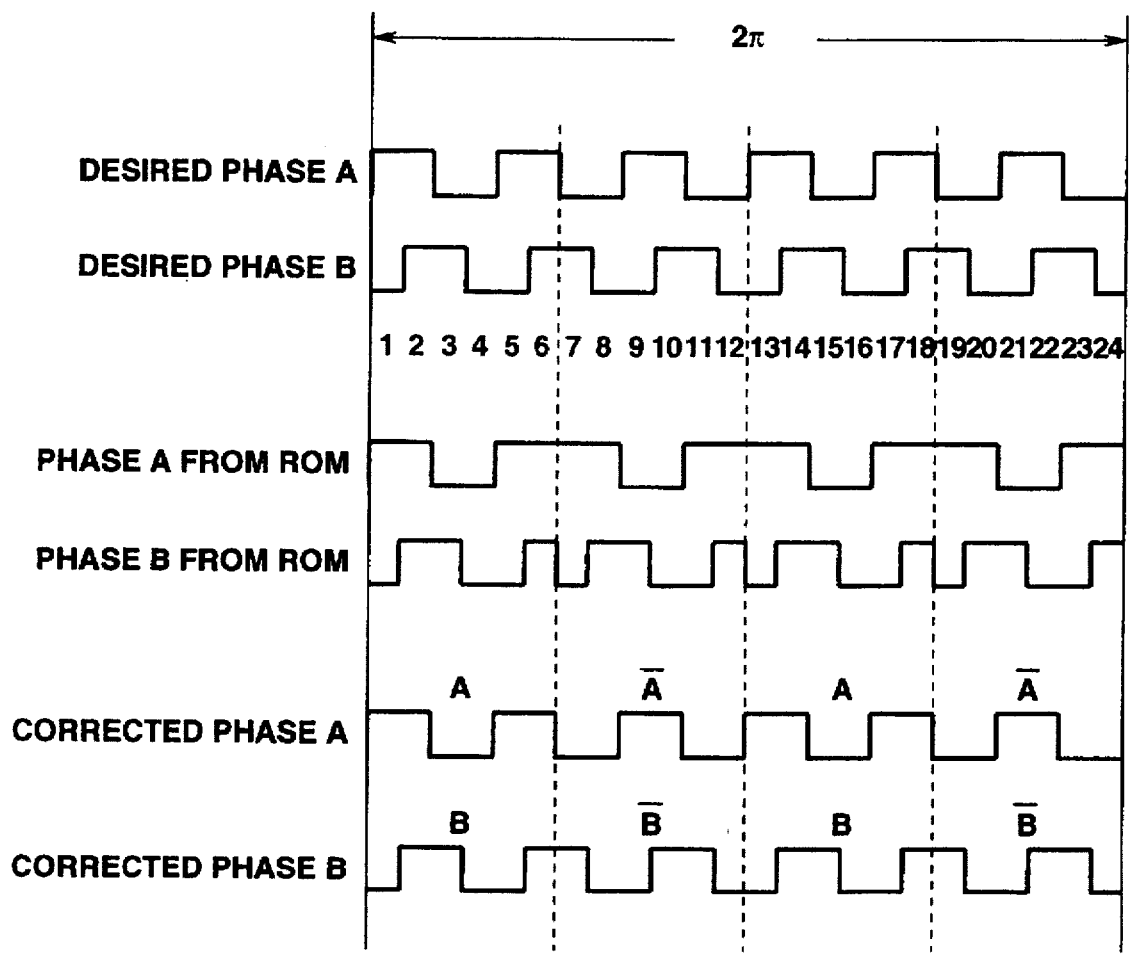
FIG. 13 is a wave form graph for explaining an interpolation method for executing an interpolation by dividing one-cycle into an odd multiple of 8.

FIG. 13 shows wave forms in the case where one cycle is split into 24=8×3 which is of an odd multiple of 8. The upper two wave forms denote desired wave forms. The intermediate two wave forms denote wave forms which are simply comprised of the data from the look-up table in the ROM. The lower two wave forms denote corrected wave forms of the intermediate two wave forms by inverting the previous self value at every section.

Although the above-mentioned decision of the data by each quadrant and the exchange of the data look like complicated operations, the logic circuit for executing the above-mentioned operations can be constituted by a simple AND-OR structure as shown in FIGS. 20 and 21 and therefore, it is easy to increase the processing speed.

What is claimed is:

1. An interpolation device for interpolating at least one of cyclic analog signals, the cyclic analog signal periodically changing its amplitude in correspondence to a position function of a displacement, the interpolation device comprising:

an analog-digital converter for converting the analog signal to a digital signal;

a digital filter for removing a high-frequency component of the output digital signal of said analog-digital converter;

an interpolating means for interpolating the output of said digital filter; and a hysteresis circuit disposed between said digital filter and said interpolating means.

2. An interpolation device as claimed in claim 1, wherein said digital filter is comprises a microcomputer.

3. An interpolation device as claimed in claim 1, wherein said digital filter and said hysteresis circuit are comprised of a microcomputer.

4. An interpolation device as claimed in claim 1, wherein the two analog signals to be interpolated are shifted in phase by 90°, and wherein said interpolating means comprises:

a look-up table including interpolation data corresponding to one of the four quadrants of a Lissajous figure formed at a time when the analog signals are disposed on an x-y plane; and quadrant converting means for providing interpolation data for others of said quadrants of said nissajous figure by utilizing the data stored in the look-up table.

5. An interpolation device as claimed in claim 4, wherein said quadrant converting means comprises means for executing a quadrant conversion of the data in the look-up table such that the logical value of the most significant bit or reference bit of each of the digital signals is detected and a part of the digital signal except for the most significant bit or reference bit is inverted or not inverted and exchanged according to the detected logical value.

6. An interpolation device as claimed in claim 5, wherein interpolation data stored in the look-up table comprises 2 bit gray-code signals of a small cycle, which signals are obtained by splitting the cycle of the supplied analog signal into a multiple of 16.

7. An interpolation device as claimed in claim 5, wherein interpolation data stored in the look-up table comprises 2 bit gray-code signals of a small cycle, which signals are obtained by splitting the cycle of the supplied analog signal into an odd multiple of 8, said quadrant converting means executing a read out control of the look-up table so that the 2 bit gray-code signal is inverted and outputted when the interpolation is executed relative to the quadrant adjacent to the quadrant of the look-up table.

8. An interpolation device as claimed in claim 5, wherein interpolation data stored in the look-up table comprises 2 bit gray-code signals of a small cycle, which signals are obtained by splitting the cycle of the supplied analog signal into an odd multiple of 4, and wherein said quadrant converting means comprises means for executing a read out control of the look-up table so that one of the 2 bit gray-code signals of phase A and phase B is replaced by the previous value of the other 2 bit gray-code signal and the other 2 bit gray-code signal is replaced by the previous inversion signal of the 2 bit gray-code signal when the interpolation is executed relative to the quadrant adjacent to the quadrant of the look-up table.

9. An interpolation device as claimed in claim 5, wherein interpolation data stored in the look-up table comprises three sets of data of 2 bit gray-code signals of a small cycle, which signals are obtained by splitting the cycle of the supplied analog signal into a multiple of 16, into an odd multiple of 8 and into an odd multiple of 4, and wherein said quadrant converting means comprises means for executing a read out control of the look-up table so that the 2 bit gray-code signal is inverted and outputted when the interpolation is executed relative to the quadrant adjacent to the quadrant of the look-up table.

10. An interpolation device as claimed in claim 5, wherein said interpolating means includes an adder which adds an offset value of a split number to the data obtained from the look-up table according to the position of the quadrants.

11. An interpolation device as claimed in claim 10, wherein said interpolating means comprises a difference value generating section which obtains a difference between a previous value and a present value of the output of the adder while the output of the adder is held by each sampling.

12. An interpolation device as claimed in claim 11, wherein said interpolating means comprises an A/B phase converter which converts the output data of the difference value generating section into a two-phase pulse train.

* * * * *